(12) United States Patent
Yoshida et al.

(10) Patent No.: US 8,872,213 B2
(45) Date of Patent: Oct. 28, 2014

(54) SEMICONDUCTOR LIGHT EMITTING DEVICE

(71) Applicant: Panasonic Corporation, Osaka (JP)

(72) Inventors: Shinji Yoshida, Shiga (JP); Kazuhiko Yamanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/011,445

(22) Filed: Aug. 27, 2013

(65) Prior Publication Data

US 2013/0341666 A1 Dec. 26, 2013

Related U.S. Application Data

(63) Continuation of application No. PCT/JP2011/003752, filed on Jun. 30, 2011.

(30) Foreign Application Priority Data

Mar. 31, 2011 (JP) .................. 2011-079273

(51) Int. Cl.
*H01L 33/00* (2010.01)
*H01L 23/00* (2006.01)
*H01L 33/62* (2010.01)
*B82Y 20/00* (2011.01)
*H01L 33/50* (2010.01)
*H01L 33/60* (2010.01)

(52) U.S. Cl.
CPC ......... *H01L 33/62* (2013.01); *H01L 2224/8592* (2013.01); *B82Y 20/00* (2013.01); *H01L 24/97* (2013.01); *H01L 33/507* (2013.01); *H01L 33/504* (2013.01); *H01L 2224/48091* (2013.01); *H01L 33/60* (2013.01); *Y10S 977/95* (2013.01); *H01L 2224/45144* (2013.01); *H01L 2933/0041* (2013.01); *H01L 33/501* (2013.01)

USPC ............................................ 257/98; 977/950

(58) Field of Classification Search
CPC ..... H01L 33/501; H01L 33/502; H01L 33/56; H01L 33/62; H01L 24/97; H01L 2933/0041; H01L 33/504; B82Y 20/00
USPC ............................................................ 257/98
See application file for complete search history.

(56) References Cited

U.S. PATENT DOCUMENTS 6,066,861 A 5/2000 Hohn et al.
6,245,259 B1 6/2001 Hohn et al.

(Continued)

FOREIGN PATENT DOCUMENTS

JP 11-500584 A 1/1999
JP 2003-017751 A 1/2003

(Continued)

OTHER PUBLICATIONS

Z. Yang et al., "A Soluble Blue-Light-Emitting Polymer", Macromolecules vol. 26, American Chemical Society, 1993, pp. 1188-1190.*

(Continued)

*Primary Examiner* — William D Coleman
(74) *Attorney, Agent, or Firm* — McDermott Will & Emery LLP

(57) ABSTRACT

A semiconductor light emitting device includes: a package which is made of a resin and includes a recess; a lead frame exposed to a bottom of the recess; a semiconductor light emitting element connected to the lead frame in the recess; a phosphor layer over the bottom of the recess; and a second resin layer above the phosphor layer and the semiconductor light emitting element, in which the phosphor layer contains a semiconductor fine particle having an excitation fluorescence spectrum which changes according to a particle size, and the phosphor layer includes a water-soluble or water-dispersible material.

13 Claims, 6 Drawing Sheets

(56) References Cited

U.S. PATENT DOCUMENTS

| | | |
|---|---|---|
| 6,277,301 B1 | 8/2001 | Hohn et al. |
| 6,576,930 B2 | 6/2003 | Reeh et al. |
| 6,900,587 B2 | 5/2005 | Suehiro et al. |
| 6,960,878 B2 * | 11/2005 | Sakano et al. .............. 313/512 |
| 7,078,732 B1 | 7/2006 | Reeh et al. |
| 7,504,272 B2 | 3/2009 | Ajiki et al. |
| 8,025,816 B2 | 9/2011 | Murase et al. |
| 8,598,618 B2 * | 12/2013 | Ishii et al. .................. 257/100 |
| 2001/0002049 A1 | 5/2001 | Reeh et al. |
| 2003/0002272 A1 | 1/2003 | Suehiro et al. |
| 2006/0097624 A1 | 5/2006 | Murase et al. |
| 2007/0096113 A1 * | 5/2007 | Inoshita et al. ............. 257/79 |
| 2008/0108159 A1 | 5/2008 | Ajiki et al. |
| 2010/0044731 A1 * | 2/2010 | Tokunaga et al. ........... 257/98 |
| 2010/0193806 A1 * | 8/2010 | Byun .......................... 257/88 |
| 2011/0006673 A1 * | 1/2011 | Yano et al. .................. 313/512 |
| 2014/0021503 A1 * | 1/2014 | Yoshida et al. .............. 257/98 |

FOREIGN PATENT DOCUMENTS

| | | |
|---|---|---|
| JP | 2005-327820 A | 11/2005 |
| JP | 2008-117976 A | 5/2008 |
| JP | 2008-192909 A | 8/2008 |
| JP | 2010-126596 A | 6/2010 |
| JP | 2010-232203 A | 10/2010 |
| WO | 04-000971 A1 | 12/2003 |

OTHER PUBLICATIONS

International Search Report issued in PCT/JP2011/003753, dated Sep. 6, 2011, with English translation.

Leu Yun et al.; Incorporating fluorescent quantum dots in to water-soluble polymer. J. Lumin, vol. 128, No. 3, Mar. 2008.

International Search Report issued in PCT/JP2011/003752, dated Sep. 6, 2011, with English translation.

Leu Yun et al.; Incorporating fluorescent quantum dots into water-soluble polymer. J. Lumin, vol. 128, No. 3, Mar. 2008.

* cited by examiner

SEMICONDUCTOR LIGHT EMITTING DEVICE

CROSS REFERENCE TO RELATED APPLICATIONS

This is a continuation application of PCT International Application No. PCT/JP2011/003752 filed on Jun. 30, 2011, designating the United States of America, which is based on and claims priority of Japanese Patent Application No. 2011-079273 filed on Mar. 31, 2011. The entire disclosures of the above-identified applications, including the specifications, drawings and claims are incorporated herein by reference in their entirety.

FIELD

The present disclosure relates generally to semiconductor light emitting devices and, in particular, to a semiconductor light emitting device including a phosphor layer containing quantum dot phosphors.

BACKGROUND

High-intensity white light emitting diodes (LEDs) are used as light sources for lighting and liquid crystal display backlight, for example, and efforts are being made to improve the efficiency and color rendering properties of the light sources. A white LED is, for example, made by appropriately combining a semiconductor light emitting element which emits blue light and a green phosphor, a yellow phosphor, or a red phosphor. The types of phosphors range from an inorganic phosphor to an organic phosphor to a quantum dot phosphor made of a semiconductor. Patent Literature 1 is an example of the white LED including the inorganic phosphor.

FIG. 13 is a cross-sectional view illustrating the conventional semiconductor light emitting device disclosed in Patent Literature 1.

As shown in FIG. 13, in a conventional semiconductor light emitting device 100, a semiconductor light emitting element 101 which emits ultraviolet light, blue light, or green light is disposed in a container 108 where electric terminals 102 and 103 are embedded, and the inside of the container 108 is filled with a material 105 (casted epoxy resin layer) containing light emitting particles 106 (inorganic pigment of a light emitting substance) so as to cover the semiconductor light emitting element 101. It should be noted that the electrode of the semiconductor light emitting element 101 is electrically connected to the electric terminal 103 via a gold wire 107.

CITATION LIST

Patent Literature

[PTL 1] Japanese Unexamined Patent Application Publication No. 11-500584

SUMMARY

Technical Problem

Because of their small sizes and power consumption, LED light sources are used as key devices of display devices and lighting equipment, and efforts are being made to improve the efficiency and color rendering properties of high-intensity white LEDs. White LED light sources are generally the combination of blue LEDs and green phosphors or yellow phosphors. To realize high efficiency and high color rendering properties, phosphors are required which have excellent light emitting properties and energy conversion efficiency. General phosphors for use in white LEDs are crystal fine particles having rare earth ions as an activator, and are often chemically unstable. However, while the light absorption efficiency of these phosphors is in proportion to the concentration of rare earths, too high concentration decreases efficiency of light emission due to concentration quenching. Thus, it has been difficult to realize a high quantum efficiency of at least 80%.

Therefore, many types of semiconductor phosphor fine particles have been suggested which enable high quantum efficiency by directly using light absorption or light emission at a band edge. In particular, fine particles having a diameter of several nm to several dozen nm, called quantum dot phosphors are expected to be introduced as new phosphor materials which do not include rare earths. Even if fine particles are made of the same material, by controlling a particle size with quantum size effects, a quantum dot phosphor can obtain a fluorescence spectrum of a desired wavelength range in a visible light region. Moreover, a high external quantum efficiency of around 90% is indicated on account of light absorption and fluorescence at a band edge. Therefore, it is possible to provide white LEDs with high efficiency and high color rendering properties.

However, as quantum dot phosphors have a small size, the ratio of atoms on the surfaces of the fine particles is high. Thus, the quantum dot phosphors are often chemically unstable. In particular, for excited fluorescence under high temperature environment, a major problem is that photo-oxidation reaction proceeds on the surfaces of the quantum dot phosphors, which leads to a sudden decline in efficiency of light emission.

Moreover, when a white LED is formed using the quantum dot phosphors, the thermal conductivity of a casted epoxy resin layer is low in the case where a container which contains a resin layer containing the quantum dot phosphors has a structure as the container 108 recited in Patent Literature 1. Therefore, in an area away from a package and a frame resin layer which function as heat sinks, there is a problem that heat generation due to strokes loss caused by the quantum dot phosphors leads to high temperature in the resin layer, thus degrading the quantum dot phosphors and decreasing efficiency of light emission.

One non-limiting and exemplary embodiment provides a semiconductor light emitting device with high reliability which can reduce decline in efficiency of light emission by avoiding the temperature rise in semiconductor fine particles such as quantum dot phosphors.

Solution to Problem

To solve the above problem, a first semiconductor light emitting device according to the present disclosure includes: a package which is made of a resin and includes a recess; a lead frame exposed to a bottom of the recess; a semiconductor light emitting element connected to the lead frame in the recess; a first resin layer over the bottom of the recess; and a second resin layer above the phosphor layer and the semiconductor light emitting element, in which the first resin layer contains a semiconductor fine particle having an excitation fluorescence spectrum which changes according to a particle size, and the first resin layer includes a water-soluble or water-dispersible material.

According to this structure, the semiconductor fine particles can be emulsified with the first resin layer, and the first resin layer containing the semiconductor fine particles can be formed at high concentration and uniformity. Furthermore, since the first resin layer can be formed over the exposed lead frame, heat dissipation of the first resin layer can be improved. This can avoid temperature rise in the semiconductor fine particles and decline in efficiency of light emission. Therefore, it is possible to provide a semiconductor light emitting device with high efficiency, high color rendering properties, and high reliability.

Moreover, preferably the first semiconductor light emitting device according to the present disclosure should further include a metal reflective film over the bottom and a side of the recess, in which the first resin layer covers the metal reflective film.

According to this structure, it is possible to further improve the heat dissipation of the first resin layer and provide a semiconductor light emitting device with higher reliability.

Moreover, in the first semiconductor light emitting device according to the present disclosure, preferably the semiconductor fine particle should have a layer structure of at least two layers an outermost layer among which is hydrophobic.

According to this structure, a semiconductor fine particle is more easily captured by the backbone structure of a water-soluble resin on account of hydrophobic interaction. Therefore, semiconductor fine particles can be kept dispersed in the first resin layer at higher concentration and uniformity. This can provide a semiconductor light emitting device with high efficiency and high color rendering properties which does not emit uneven light.

Moreover, in the first semiconductor light emitting device according to the present disclosure, preferably the first resin layer should be made of an acrylic resin, an epoxy resin, or a fluororesin.

According to this structure, since the first resin layer has oxygen resistance and moisture resistance, it is possible to provide a semiconductor light emitting device with high efficiency and high color rendering properties.

Moreover, in the first semiconductor light emitting device according to the present disclosure, the second resin layer may contain a light scattering particle which scatters visible light.

According to this structure, light emitted by the semiconductor light emitting element is also scattered backward by the second resin layer. Therefore, the first resin layer in the package is more uniformly irradiated with the light. This can provide a semiconductor light emitting device with high efficiency and high color rendering properties which does not emit uneven light.

Moreover, in the first semiconductor light emitting device according to the present disclosure, preferably the light scattering particle should be a white fine particle which reflects the visible light and has a particle size of at least 100 nm.

According to this structure, since white fine particles scatter light without absorbing the light, it is possible to provide a semiconductor light emitting device with high efficiency and high color rendering properties which does not emit uneven light.

Moreover, in the first semiconductor light emitting device according to the present disclosure, preferably the light scattering particle should be a phosphor fine particle which has a particle size of at least 100 nm, absorb part of light emitted by the semiconductor light emitting element, and have an emission spectrum including a wavelength absorbed by the semiconductor fine particle.

According to this structure, since the light scattering particles convert a part of light from the semiconductor light emitting device into a long-wavelength side, strokes loss caused by the semiconductor fine particles decreases, and temperature rise can be reduced. This can provide a semiconductor light emitting device with high reliability, high efficiency, and high color rendering properties.

Moreover, in the first semiconductor light emitting device according to the present disclosure, the semiconductor light emitting element may emit blue light, the semiconductor fine particle may emit red fluorescent light, and the light scattering particle may be a rare-earth phosphor which emits green fluorescent light.

According to this structure, white light with higher color rendering properties can be realized. In addition, since the semiconductor fine particles absorb green fluorescent light emitted by the rare-earth phosphors and emit red fluorescent light, strokes loss caused by the semiconductor fine particles decreases, which allows temperature rise to be further reduced. This can provide a semiconductor light emitting device with high reliability, high efficiency, and high color rendering properties.

Moreover, the second semiconductor light emitting device according to the present disclosure includes: a semiconductor light emitting element mounted on a package having a conductive area and a phosphor layer in contact with the conductive area, in which the phosphor layer is made up of semiconductor fine particles each having an excitation fluorescence spectrum which changes according to a particle size and a transparent resin in which the semiconductor fine particles are kept dispersed, and the transparent resin includes water-soluble or water-dispersible material, and is made from a mixed solution of the semiconductor fine particles and the transparent resin.

According to this structure, when the semiconductor fine particles are emulsified with a water-soluble resin solvent, a phosphor layer can be formed at high concentration and uniformity, and when the phosphor layer is placed over the conductive area which functions as a heat sink, the heat dissipation of the phosphor layer is improved. This can provide a semiconductor light emitting device with high efficiency, high color rendering properties, and high reliability.

Moreover, in the second semiconductor light emitting device according to the present disclosure, preferably the semiconductor fine particle should have a layer structure of at least two layers an outermost layer among which is hydrophobic.

According to this structure, the semiconductor fine particle is more easily captured by the backbone structure of a water-soluble resin on account of hydrophobic interaction. Therefore, semiconductor fine particles can be kept dispersed in a transparent resin at high concentration and uniformity. This can provide a semiconductor light emitting device with high efficiency and high color rendering properties which does not emit uneven light.

Moreover, in the second semiconductor light emitting device according to the present disclosure, preferably a phosphor layer should be formed by an electrodeposition process.

According to this structure, since an ionic resin can cause semiconductor fine particles dispersed in the solution to electrically migrate to the surface of a substrate, the semiconductor fine particles can be kept dispersed in the transparent resin at high concentration and uniformity. This can provide a semiconductor light emitting device with high efficiency and high color rendering properties which does not emit uneven light.

Moreover, in the second semiconductor light emitting device according to the present disclosure, preferably the first resin layer containing semiconductor fine particles should be made of an acrylic resin, an epoxy resin, or a fluororesin.

According to this structure, the semiconductor fine particles can be contained and dispersed in the transparent resin having oxygen resistance and moisture resistance. This can provide a semiconductor light emitting device with high efficiency and high color rendering properties.

Moreover, in the second semiconductor light emitting device according to the present disclosure, preferably a light scattering layer should be provided above the phosphor layer and the semiconductor light emitting element, and the light scattering layer should be made up of light scattering particles which scatter visible light and a transparent resin in which the light scattering particles are kept dispersed.

According to this structure, light emitted by the semiconductor light emitting element is also scattered backward by the light scattering layer, and the phosphor layer provided in the package is uniformly irradiated with the light. This can provide a semiconductor light emitting device with high efficiency and high color rendering properties which does not emit uneven light.

Moreover, in the second semiconductor light emitting device according to the present disclosure, preferably the light scattering particle contained in a light scattering layer should be a white fine particle which reflects the visible light and has a particle size of at least 100 nm.

According to this structure, since white fine particles scatter light without absorbing the light, it is possible to provide a semiconductor light emitting device with high efficiency and high color rendering properties which does not emit uneven light.

Moreover, in the second semiconductor light emitting device according to the present disclosure, preferably the light scattering particle should be a phosphor fine particle which has a particle size of at least 100 nm, absorb part of light emitted by the semiconductor light emitting element, and have an emission spectrum including a wavelength absorbed by the semiconductor fine particle contained in a phosphor layer.

According to this structure, since the light scattering particles convert a part of light from the semiconductor light emitting device into a long-wavelength side, strokes loss caused by the semiconductor fine particles decreases, and temperature rise can be reduced. This can provide a semiconductor light emitting device with high reliability, high efficiency, and high color rendering properties.

Moreover, in the second semiconductor light emitting device according to the present disclosure, preferably the semiconductor light emitting element should emit blue light, the semiconductor fine particle should emit red fluorescent light, and the light scattering particle should be a rare-earth phosphor which emits green fluorescent light.

According to this structure, white light with higher color rendering properties can be realized. In addition, since the semiconductor fine particles absorb green fluorescent light emitted by the rare-earth phosphors and emit red fluorescent light, strokes loss caused by the semiconductor fine particles decreases, which allows temperature rise to be further reduced. This can provide a semiconductor light emitting device with high reliability, high efficiency, and high color rendering properties.

Moreover, a production method of the second light emitting device according to the present disclosure includes: forming a metal reflective film in the inner wall of the package having a conductive area, except an area for mounting a semiconductor light emitting element and an area to be connected with the semiconductor light emitting element via a wire; forming a phosphor layer over the metal reflective film by an electrodeposition process in a condition where electrical insulation between the electrodes of the semiconductor light emitting element is maintained; and forming a light scattering layer above the phosphor layer.

According to this structure, since the contact area of the phosphor layer and the metal reflective film with a good thermal conductivity is large, temperature rise in the phosphor layer can be reduced. This can fabricate a semiconductor light emitting device with high reliability, high efficiency, and high color rendering properties.

Advantageous Effects

According to one or more exemplary embodiments or features disclosed herein, temperature rise in semiconductor phosphor fine particles (quantum dot phosphors) can be avoided. Therefore, it is possible to provide a semiconductor light emitting device with high reliability, high efficiency, and high color rendering properties.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
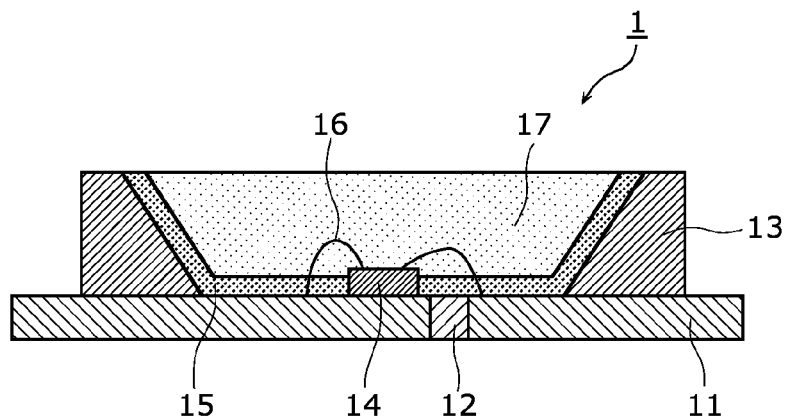
FIG. 1 is a cross-sectional schematic view of a semiconductor light emitting device according to the first embodiment.

Although the following describes semiconductor light emitting devices according to the embodiments of the present disclosure with reference to drawings, the scope of the present disclosure is determined based on the description of Claims. Among the structural elements in the following description, the structural elements not recited in Claims are not necessarily required to achieve the problem of the present disclosure, but are used to form a preferable embodiment. It should be noted that in the drawings, the same reference numerals are given to the same structural elements, and the detailed explanation will be omitted or simplified.

Embodiment 1

With reference to FIG. 1, the following describes a semiconductor light emitting device 1 according to the first embodiment. FIG. 1 is a cross-sectional schematic view of a semiconductor light emitting device according to the first embodiment.

In the first embodiment, a lead frame package is used as a package. Moreover, the semiconductor light emitting device 1 according to the first embodiment is a white LED light source which emits white light.

The semiconductor light emitting device 1 according to the first embodiment includes a package (container) having a recess formed by light reflective resin layers 12 and 13, a lead frame 11 exposed to the bottom of the recess, a semiconductor light emitting element 14 placed on the lead frame 11 in the recess, a phosphor layer 15 (first resin layer) over the bottom in the recess, and a resin layer 17 (second resin layer) above the phosphor layer 15 and the semiconductor light emitting element 14.

The semiconductor light emitting element 14 in the present embodiment is a bare chip LED, and is mounted on a predetermined area on the lead frame 11. The P electrode and the N electrode of the semiconductor light emitting element 14 respectively have electric contacts with the lead frame 11 via gold wires 16.

The phosphor layer 15 is formed over the exposed lead frame 11 in the package. This means that the phosphor layer 15 is formed so as to come in contact with a conductive area which functions as a heat sink of the lead frame 11. This improves the heat dissipation of the phosphor layer 15. It should be noted that the phosphor layer 15 is formed over the areas other than the contact areas between the gold wires 16 and the lead frame 11 and the area for mounting the semiconductor light emitting element 14.

Moreover, the phosphor layer 15 in the present embodiment is not only formed over the bottom of the recess in the package, but also formed over the side of the recess (inside wall of the light reflective resin layer 13). This means that the phosphor layer 15 of substantially the same thickness covers the inside of the recess of the package.

It should be noted that a package in a cup shape is formed by the lead frame 11 and the light reflective resin layer 13 in the present embodiment. The resin layer 17 is made of a transparent resin, and the inside of the package is filled with the resin layer 17 as a sealing resin. It should be noted that the resin layer 17 in the present embodiment is made of only the transparent resin.

The phosphor layer 15 is made up of a water-soluble or water-dispersible resin material and quantum dot phosphors. Specifically, in the phosphor layer 15, quantum dot phosphors are uniformly dispersed in a transparent resin having oxygen barrier properties and moisture resistance. In the present embodiment, an epoxy resin is used as the transparent resin of the phosphor layer 15. The epoxy resin has an oxygen permeability around double-digit to triple-digit lower than that of a silicone resin, and is one of the resins which can be easily soluble or dispersed in water by amination. Moreover, a resin other than the epoxy resin can be used as the transparent resin of the phosphor layer 15. For example, a transparent resin made of a fluororesin or an acrylic resin also has high oxygen barrier properties and high moisture resistance. Thus, by using a material having oxygen barrier properties and moisture resistance for the transparent resin of the phosphor layer 15, it is possible to efficiently suppress photo-oxidation reaction for the quantum dot phosphors. Moreover, a semiconductor fine particle having an excitation fluorescence spectrum which varies according to a particle size can be used as the quantum dot phosphor of the phosphor layer 15. In the quantum dot phosphor, the excitation fluorescence spectrum changes according to the particle size, and the emission wavelength of the quantum dot phosphor can be adjusted by changing the particle size.

The fabrication of the phosphor layer 15 includes the dispersion process in which quantum dot phosphors (phosphor fine particles) are dispersed in a resin solution and a resin fabrication process. The respective process will be described.

The following describes the dispersion process of the quantum dot phosphors. As mentioned above, the phosphor layer 15 is formed of a water-soluble or water-dispersible resin solvent. The water-soluble resin has a resin molecular framework a part of which is ionized in aqueous solution or has an electrical polarity. The polar part of a resin molecule and an ionized area are stabilized by hydration. Therefore, the water-soluble resin is dissolved or dispersed in water, and can be emulsified.

Figure 2:
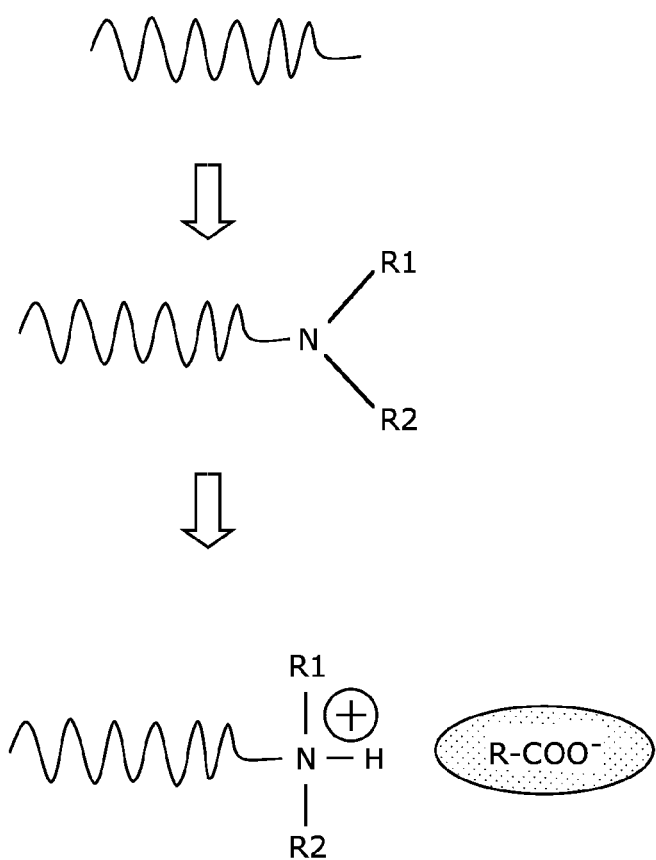
FIG. 2 is a schematic view illustrating the process of water-solubilization of an epoxy resin used in a semiconductor light emitting device according to the first embodiment.

FIG. 2 illustrates the process of water-solubilization of an epoxy resin used in the present embodiment. As shown in FIG. 2, an epoxy resin can be ionized by aminating the end of the epoxy resin and neutralizing with an acid. In the present embodiment, an acetic acid is used as an acid for neutralization.

Figure 3:
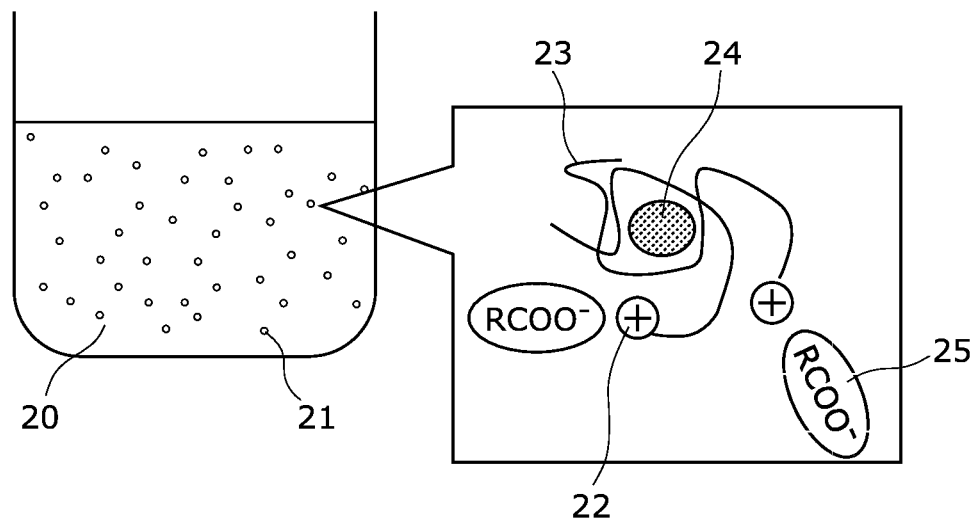
FIG. 3 is a schematic view illustrating how a quantum dot phosphor is captured by a resin.

FIG. 3 illustrates how a quantum dot phosphor is captured by a resin. As shown in FIG. 3, by adding quantum dot phosphors 21 to a resin solution 20 neutralized with an acetic acid 25, a backbone 23 of the epoxy resin solvent molecule having an aminated positive ion part 22 captures a quantum dot phosphor 24. This enables to uniformly disperse the quantum dot phosphors 21 into the resin solution 20.

Here, when the particle size of the phosphor fine particle is large, the phosphor fine particle is not sufficiently captured by the backbone of the resin solvent molecule, and is deposited or settles in the resin solution 20.

Here, the particle sizes of commercial rare-earth phosphors are 1 μm to 100 μm, and are far larger than the size of a resin solvent molecule. Therefore, many resin molecules are required for capturing one rare-earth phosphor fine particle. This decreases dispersion concentration and causes a deposition phenomenon in a water-soluble resin, resulting in uneven intensity and light emission.

On the other hand, the particle size of the quantum dot phosphor is around 1 nm to 20 nm, which is equivalent to or less than or equal to the size of a water-soluble resin molecule. Therefore, it is possible to disperse quantum dot phosphors in a resin solution uniformly and at high concentration.

The semiconductor fine particles used in the present embodiment are quantum dot phosphors having InP as a nucleus and a diameter of around 1 nm to 10 nm. The material of the phosphors may be a water-insoluble material, and may be, for example, a known cadmium quantum dot phosphor or chalcogenide fine particle, in addition to InP.

The following describes a resin fabrication process of the phosphor layer 15. In the first embodiment, an atomization method (spray method) is used for a resin coating process. The atomization process is a method for applying, by atomized spray, a resin solvent which captured fine particles to a material to be coated. As long as the wettability of the material to be coated is good, a resin coating can be formed on anything.

A lead frame package includes a resin area and a metal area. To further improve the wettability of the resin aqueous solution, the surface of the package is hydrophilized by plasma treatment with a mixed gas of Ar and $H_2$ or a mixed gas of Ar and $O_2$.

The resin solvent containing quantum dot phosphors is atomized and sprayed on the lead frame 11, and then heated to cure the resin.

It should be noted that an area in the lead frame 11 for mounting the semiconductor light emitting element 14 and areas in the lead frame 11 to be connected with the gold wires 16 are protected by resists in advance. After spraying the phosphors, the resists are removed and the resin is thermally cured, so that the phosphor layer 15 can be formed on only the desired place.

Moreover, in the first embodiment, to prevent the exposure of the semiconductor light emitting element 14 and the phosphor layer 15, the resin layer 17 made of a transparent silicone resin is filled in the package. It should be noted that although the resin layer 17 aims at protecting the semiconductor light emitting element 14 and the phosphor layer 15, a material for protecting the semiconductor light emitting element 14 and the phosphor layer 15 is not necessarily the resin layer 17. For example, instead of filling with the resin layer 17, a transparent glass plate may be used for sealing. Moreover, although the lead frame package is used in the present embodiment, a ceramic package formed of a ceramic and a metal package may be used to form the phosphor layer 15.

Thus, according to the first embodiment, the quantum dot phosphors in the phosphor layer 15 and a resin material can be emulsified. Therefore, the quantum dot phosphors can be dispersed in the phosphor layer 15 at high concentration and uniformity. Moreover, since the phosphor layer 15 can be formed on the exposed lead frame 11, the heat dissipation of the phosphor layer 15 can be improved. This can reduce temperature rise in the phosphor layer 15 and decline in efficiency of light emission. Therefore, it is possible to provide a semiconductor light emitting device with high efficiency, high color rendering properties, and high reliability.

Embodiment 2

The following describes a semiconductor light emitting device according to the second embodiment.

Many of quantum dot phosphors have a two-layer or three-layer structure called core-shell structure for improving efficiency of light emission and reliability. However, to efficiently disperse into a water-soluble resin solvent, the chemical properties of the outermost layer of a quantum dot are important.

As shown in FIG. 3, although a water-soluble resin and a water-dispersible resin have a resin skeleton the end of which is ionized or has a polar functional group, the molecular framework is formed of hydrocarbon such as an alkyl backbone and has little polarity. This means that interaction with water is small, and the water-soluble resin and the water-dispersible resin function as hydrophobic groups. For a quantum dot phosphor to be captured by the backbone of a water-soluble resin, the outermost layer of the quantum dot needs to be formed of a non-polar or weak polar ligand or layer. According to this structure, the quantum dot phosphors are more easily captured by a resin backbone on account of hydrophobic interaction. Therefore, the quantum dot phosphors can be emulsified and uniformly dispersed in a resin aqueous solution.

Figure 4:
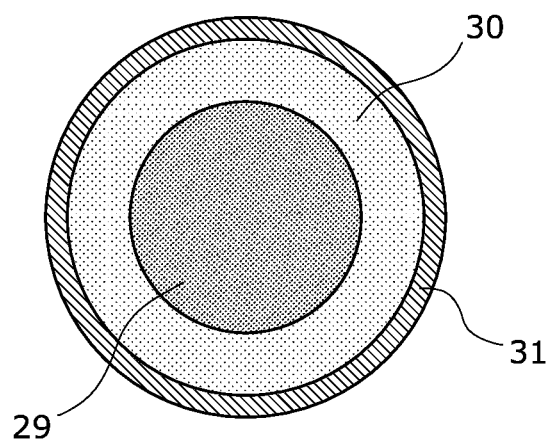
FIG. 4 is a cross-sectional schematic view of a quantum dot phosphor in a semiconductor light emitting device according to the second embodiment.

FIG. 4 is a cross-sectional structure of a quantum dot phosphor in a semiconductor light emitting device according to the second embodiment. It should be noted that since the structural elements other than the structure of the quantum dot phosphors are the same as the first embodiment, detailed description will be omitted or simplified.

As shown in FIG. 4, the quantum dot phosphor used in the second embodiment has a three-layer structure, and includes a core 29 of InP and a shell layer 30 of ZnS formed to cover the outer surface of the core 29. Moreover, as the outermost layer, octane hydrocarbon is bound to the outer surface of the shell layer 30 as a ligand which means that a ligand layer 31 is provided. Thus, by forming, as the outermost layer, the ligand layer 31 of hydrocarbon which is a hydrophobic layer having strong hydrophobic nature, a quantum dot phosphor is efficiently captured by the backbone of a resin molecule in an aqueous solution. As a result, quantum dot phosphors can be emulsified at high concentration and uniformity. This allows quantum dot phosphors to be dispersed into a resin solution at higher concentration and uniformity. Therefore, it is possible to provide a semiconductor light emitting device with high efficiency and high color rendering properties which does not emit uneven light.

It should be noted that since the quantum dot phosphor has a small core diameter, even it has a multi-layer structure including a core, a shell layer, and a ligand layer, the diameter of the quantum dot phosphor is around 10 nm to 100 nm. Therefore, the size of the quantum dot phosphor does not affect the dispersion into the resin solution. Therefore, the shell layer 30 and the ligand layer 31 are not particularly limited as long as they are made of a material which cannot be decomposed by water. Preferably, the ligand layer 31 should have strong hydrophobic interaction with a resin solution. Therefore, a molecule having an alkyl backbone is preferable. On the other hand, a smaller molecular weight is preferable in order to improve dispersibility into the resin solution. Specifically, since the ligand layer 31 needs to exist as a liquid at room temperature, the number of carbons should be preferably 15 or less.

Moreover, as mentioned above, the quantum dot phosphor has features that a fluorescence wavelength changes according to particle sizes. Therefore, when the semiconductor light emitting element 14 emits blue light, in order to fabricate the phosphor layer 15 (phosphor film) which gives white fluorescence, a phosphor layer may be formed which contains both (i) a quantum dot phosphor of the particle size at which red fluorescence is given and (ii) a quantum dot phosphor of the particle size at which green fluorescence is given.

An InP quantum dot phosphor according to the present embodiment has a particle size of around 5 nm to 8 nm for a green phosphor, while it has the largest particle size of around 10 nm to 20 nm for a red phosphor. Therefore, as long as they are quantum dot phosphors, regardless of the red phosphor, the green phosphor, and the blue phosphor smaller than the red and green phosphors, it is possible to disperse into the resin solution all the quantum dot phosphors in terms of the particle size which give fluorescence in a visible light region. Thus, a desired luminescent color can be obtained by mixing quantum dot phosphors of different particle sizes (different fluorescence wavelengths) in the resin solution.

Embodiment 3

Figure 5:
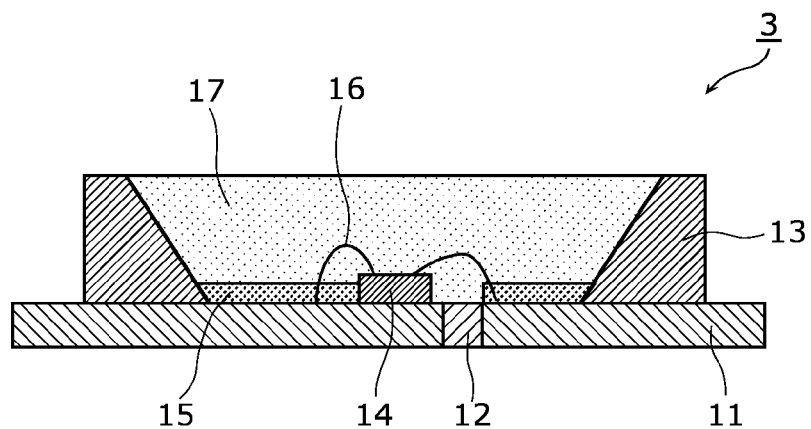
FIG. 5 is a cross-sectional schematic view of a semiconductor light emitting device according to the third embodiment.

With reference to FIG. 5, the following describes a semiconductor light emitting device 3 according to the third embodiment. FIG. 5 is a cross-sectional schematic view of a semiconductor light emitting device according to the third embodiment.

As shown in FIG. 5, the semiconductor light emitting device 3 according to the third embodiment includes a lead frame 11 and light reflective resin layers 12 and 13, as same as the first embodiment. A semiconductor light emitting element 14 is mounted on the lead frame 11. The P electrode and N electrode of the semiconductor light emitting element 14 have electric contacts with the lead frame 11 via gold wires 16.

The difference between the present embodiment and the first embodiment is in the structure of the phosphor layer 15. The phosphor layer 15 according to the present embodiment is formed only over the bottom of the recess of a package. In other words, on the conductive area which functions as a heat sink of the lead frame 11, the phosphor layer 15 is formed over the areas other than the contact areas with the gold wires 16 and the area for mounting the semiconductor light emitting element 14. Therefore, in the inner surface of the light reflective resin layer 13, the phosphor layer 15 is formed only at the lowermost part, and the phosphor layer 15 is not formed over most of the slope. It should be noted that as same as the first embodiment, the resin layer 17 of a transparent resin is filled in a package in a cup shape formed by the lead frame 11 and the light reflective resin layer 13.

Moreover, the semiconductor light emitting device 3 according to the present embodiment is fabricated using an electrodeposition method as a method for forming a resin layer (phosphor layer 15) from the resin solution. The electrodeposition method is a method for applying a voltage to a material to be coated which is soaked in the resin solution, and forming a coating on a material surface to be coated, with an ionic resin solvent which captured quantum dot phosphors by electrophoresis and electrochemical reaction. In the electrodeposition method, since a coating is formed by the electrochemical reaction, it is possible to form a resin layer of a uniform film thickness, and even if the material to be coated has a complicated surface shape, a uniform coating can be formed. However, since the electrochemical reaction is used as a principle, resin layers cannot be formed on materials other than conductive materials to be coated, by the electrodeposition method.

Figure 6:
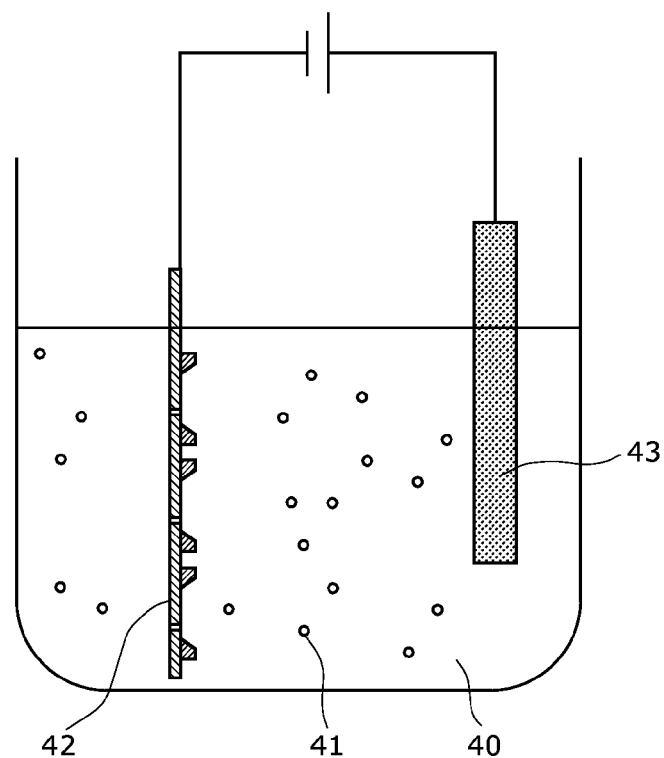
FIG. 6 is a schematic view for explaining an electrodeposition process in a semiconductor light emitting device according to the third embodiment.

In the present embodiment, the phosphor layer 15 is formed using a cationic electrodeposition method. FIG. 6 is a schematic view of the electrodeposition process.

As shown in FIG. 6, a cathode electrode 42 as a lead frame which is a material to be coated and an anode electrode 43 which is a counter electrode are soaked in an epoxy resin solution 40 containing dispersed quantum dot phosphors 41. The epoxy resin is aminated (positively ionized), and by using the cathode electrode 42 as a lead frame, an electro-deposited film is formed over a conductive area of the lead frame. On the other hand, if the resin solvent is an acid system, a material to be coated is an anode. Therefore, an anionic electrodeposition method is used. The resin coating film obtained by these methods is finished after a drying process and a curing process.

FIGS. 7A to 7D each illustrate a part of a cross-sectional view of a process in the production method of the semiconductor light emitting device according to the third embodiment.

Figure 7A:
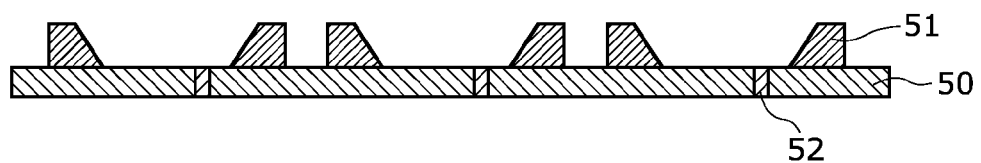
FIG. 7A is a cross-sectional view for the process of forming light reflective resin layers in a production method of a semiconductor light emitting device according to the third embodiment.
Figure 7B:
FIG. 7B is a cross-sectional view for the process of forming a phosphor layer in a production method of a semiconductor light emitting device according to the third embodiment.

As shown in FIG. 7A, light reflective resin layers 51 and 52 are attached to a lead frame 50. Resists for insulation protection are applied in advance to the area for mounting a semiconductor light emitting element 14 and the contact areas to be connected with gold wires 16, on the lead frame 50. As shown in FIG. 7B, a phosphor layer 53 containing quantum dot phosphors is formed over conductive areas of the lead frame 50 by the electrodeposition process shown in FIG. 6. Here, the phosphor layer 53 is not electrodeposited over the light reflective resin layers 51 and 52. After removing the resists, drying and curing are performed.

Figure 7C:
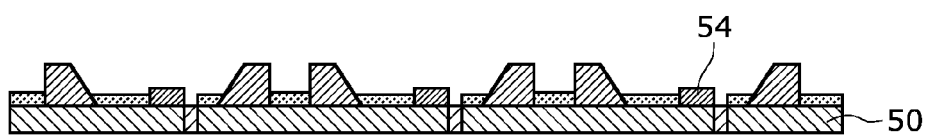
FIG. 7C is a cross-sectional view for the process of mounting semiconductor light emitting elements in a production method of a semiconductor light emitting device according to the third embodiment.
Figure 7D:
FIG. 7D is a cross-sectional view of a wire bonding process in a production method of a semiconductor light emitting device according to the third embodiment.

As shown in FIG. 7C, a semiconductor light emitting element 54 is mounted on a predetermined area on the lead frame 50. As shown in FIG. 7D, the electrodes of the semiconductor light emitting element 54 and the electrode terminals of the lead frame 50 (not shown) are electrically connected via gold wires 55 (wire-bonded).

Thus, according to the semiconductor light emitting device in the present embodiment, since the phosphor layer 15 is formed by the electrodeposition process, an ionic resin can cause the quantum dot phosphors dispersed in the solution to electrically migrate to the lead frame, and the quantum dot phosphors can be kept dispersed in a transparent resin at high concentration and uniformity. This can provide a semiconductor light emitting device with high efficiency and high cooler rendering properties which does not emit uneven light.

It should be noted that in the first and third embodiments, after mounting a semiconductor light emitting element and connecting wires, a phosphor layer can be formed by plating bath. It should be noted that when the semiconductor light emitting element is soaked in a plating bath in a state in which a potential difference occurs between the P electrode and the N electrode, the potential difference between the electrodes causes electrochemical reaction. This results in migration or dissolution of an electrode substance. Therefore, preferably, the P side (P electrode) and the N side (N electrode) of the semiconductor light emitting element should be short-circuited so that all the conductive areas have the same potential.

Embodiment 4

The following describes a semiconductor light emitting device 4 according to the fourth embodiment. Since the structure of the semiconductor light emitting device 4 according to the present embodiment is the same as that of the semiconductor light emitting devices according to the first and third embodiments, explanation for specific structures will be omitted.

Since the lead frame package is exposed to high temperature in a solder reflow process when mounting the semiconductor light emitting element, a resin layer containing quantum dot phosphors which are kept dispersed is degraded by heat, and this may sometimes cause discoloration and detachment, for example. Therefore, in the structure of the semiconductor light emitting devices according to the first and third embodiments, preferably, a resin layer (phosphor layer 15) should be formed after mounting the semiconductor light emitting element 14.

Figure 8A:
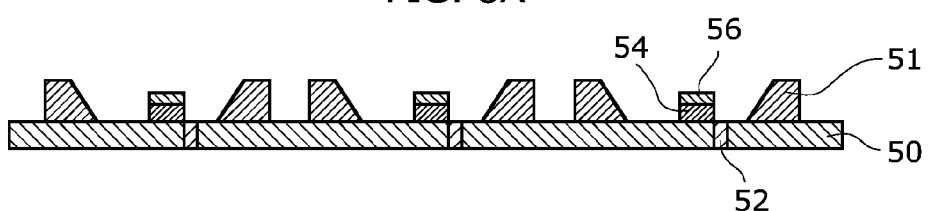
FIG. 8A is a cross-sectional view for the process of mounting semiconductor light emitting elements in a production method of a semiconductor light emitting device according to the fourth embodiment.
Figure 8B:
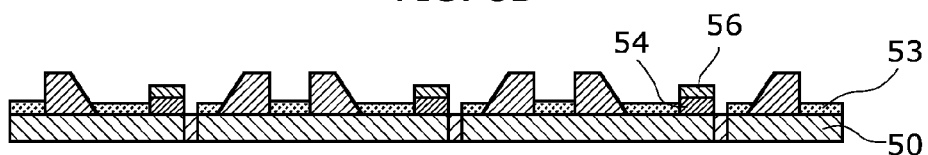
FIG. 8B is a cross-sectional view for the process of forming a phosphor layer in a production method of a semiconductor light emitting device according to the fourth embodiment.
Figure 8C:
FIG. 8C is a cross-sectional view for the process of eliminating insulating protective films in a production method of a semiconductor light emitting device according to the fourth embodiment.

Therefore, in the fourth embodiment, as shown in FIGS. 8A to 8C, a semiconductor light emitting element 54 coated with an insulating protective film 56 such as a heat resistant resist is mounted on the lead frame 50, and a resin layer (phosphor layer 53) containing quantum dot phosphors is formed by the electrodeposition process. The following describes details.

The insulating protective film 56 as a resist is applied by spin coating to a wafer before the semiconductor light emitting elements 54 are separated into chips. In the present embodiment, the insulating protective film 56 is formed over the upper electrodes of the semiconductor light emitting element 54. After chip separation by dicing, as shown in FIG. 8A, the semiconductor light emitting element 54 protected by the insulating protective film 56 is mounted on the lead frame 50 to which the light reflective resin layers 51 and 52 are attached.

By soaking the lead frame 50 in the state shown in FIG. 8A into a plating bath, using the same electrodeposition method, the phosphor layer 53 containing quantum dot phosphors can be formed over the conductive areas of the lead frame 50 as shown in FIG. 8B. Here, since the upper electrodes of the semiconductor light emitting element 54 are insulated by the insulating protective film 56, the phosphor layer 53 is not electrodeposited.

After that, as shown in FIG. 8C, by removing the insulating protective film 56 (resist), the semiconductor light emitting device 4 can be fabricated in which only the top surface of the semiconductor light emitting element 54 is not electrodeposited with the phosphor layer 53.

According to this structure, the phosphor layer containing the quantum dot phosphors can be formed only over the inner surface of the package and so as not to come in contact with the semiconductor light emitting element whose temperature becomes high. This can provide a semiconductor light emitting device with high reliability and high color rendering properties. It should be noted that in the production method in the present embodiment, it is possible to fabricate a semiconductor light emitting device having a structure similar to that of the semiconductor light emitting device 3 according to the third embodiment shown in FIG. 5.

Embodiment 5

Figure 9:
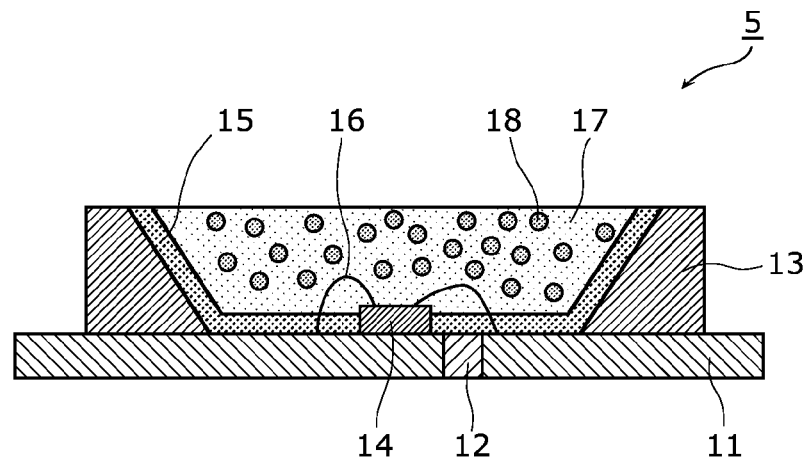
FIG. 9 is a cross-sectional schematic view of a semiconductor light emitting device according to the fifth embodiment.

With reference to FIG. 9, the following describes a semiconductor light emitting device 5 according to the fifth embodiment.

In the fifth embodiment, to avoid uneven emission, a light scattering layer for uniform irradiation toward a phosphor layer with light is formed above the phosphor layer which is formed in the first to third embodiments and in which quantum dot phosphors are dispersed. FIG. 9 is a cross-sectional schematic view of a semiconductor light emitting device according to the fifth embodiment.

As shown in FIG. 9, in the semiconductor light emitting device 5 according to the fifth embodiment, light scattering particles 18 which scatter visible light are dispersed into the resin layer 17 in the semiconductor light emitting device 1 according to the first embodiment shown in FIG. 1. In the present embodiment, white fine particles of titanium dioxide ($TiO_2$) which reflect visible light are used as the light scattering particles 18. The structure in the present embodiment can be fabricated by, for example, mixing, in advance, the light scattering particles 18 such as $TiO_2$ fine particles with a transparent resin such as a silicone resin, and injecting the transparent resin into the package after spraying and applying the phosphor layer 15.

Figure 10:
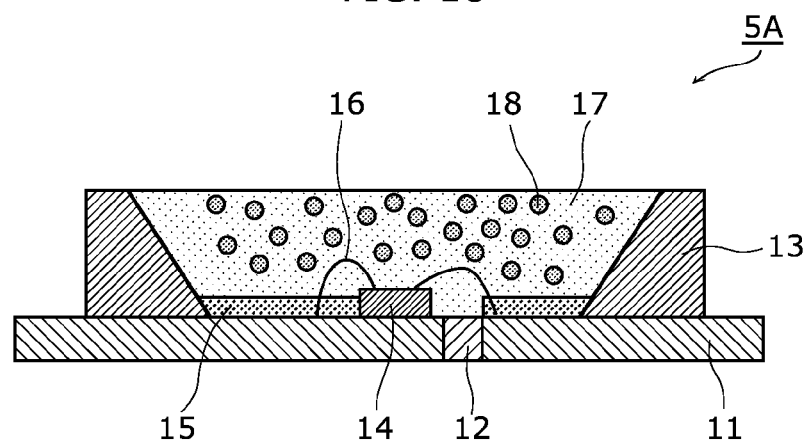
FIG. 10 is a cross-sectional schematic view of a semiconductor light emitting device according to a modification of the fifth embodiment.

Moreover, FIG. 10 illustrates a structure of a semiconductor light emitting device 5A when the phosphor layer 15 is formed by the electrodeposition method. FIG. 10 is a cross-sectional schematic view of a semiconductor light emitting device according to a modification of the fifth embodiment. As same as the atomization method, also in the electrodeposition method, the semiconductor light emitting device can be fabricated by injecting into a package a silicone resin containing the light scattering particles 18 such as $TiO_2$ fine particles after forming the phosphor layer 15. It should be noted that since the silicone resin has a heat curing temperature of around 150 degree Celsius, preferably, a resin having a high heat resistance such as an epoxy resin and a fluororesin should be used as a resin forming the phosphor layer 15.

Thus, according to the semiconductor light emitting device in the present embodiment, since the light scattering particles 18 are dispersed in the resin layer 17, light emitted by the semiconductor light emitting element 14 is scattered in the resin layer 17, so that the phosphor layer 15 is more uniformly irradiated. This can provide a semiconductor light emitting device with high efficiency and high cooler rendering properties which does not emit uneven light.

It should be noted that in the present embodiment, although a silicone resin is used as the resin layer 17, the resin forming the resin layer 17 is not particularly limited as long as the resin is transparent and is cured at a temperature lower than the fluxing temperature or the decomposition temperature of the resin forming the phosphor layer 15.

Moreover, although $TiO_2$ fine particles are used as the light scattering particles 18 in the present embodiment, fine particles of other materials may be used as long as the fine particles are white fine particles. For example, basic carbonate white lead ($2PbCO_3.Pb(OH)_2$) called white lead, ZnO called zinc flower, calcium carbonate ($CaCO_3$), a calcium sulfate hydrate ($CaSO_4.2H_2O$), or the like can be used as the light scattering particles 18.

Embodiment 6

The following describes a semiconductor light emitting device according to the sixth embodiment. The structure of a semiconductor light emitting device according to the present embodiment may be, for example, similar to the structure in the fifth embodiment shown in FIG. 7 or FIG. 10.

The fifth embodiment is based on the assumption that the light scattering particles 18 are made of a material which does not absorb the emission wavelength of the semiconductor light emitting element 14 and the fluorescence wavelength of the quantum dot phosphor. To reflect light from the semiconductor light emitting element 14 more efficiently, it is preferable that the particle size of the light scattering particles 18 be around the wavelength of light emitted by the semiconductor light emitting element 14.

The material forming the light scattering particles 18 is transparent with respect to light emitted by the semiconductor light emitting element 14. However, when the size of a fine particle (particle size) is around the wavelength of the semiconductor light emitting element 14, a scattering phenomenon of light called Mie scattering occurs. Therefore, even when fine particles are made of a transparent material with respect to the light from the semiconductor light emitting element 14, white scattering occurs.

However, for much smaller fine particles, the scattering phenomenon is occupied by light scattering called Rayleigh scattering, and scattering intensity is proportional to the 6th power of the particle size. Therefore, when the particles are too small, the fine particles are transparent again with respect to the light emitted by the semiconductor light emitting element 14.

Therefore, to scatter light efficiently, the size of the light scattering particles 18 needs to be around one quarter-wavelength to one wavelength of the light emitted by the semiconductor light emitting element 14. Accordingly, the visible light region of the white LED is 400 nm to 700 nm, and the light scattering particles 18 are required to strongly reflect blue light having the shortest wavelength. Therefore, preferably, the particle size of the light scattering particles 18 should be at least 100 nm.

Thus, according to the semiconductor light emitting device in the present embodiment, the light scattering particles 18 are white fine particles which reflect visible light and have a particle size of at least 100 nm. This allows the white fine particles to scatter light without absorbing the light. This can provide a semiconductor light emitting device with high efficiency and high cooler rendering properties which does not emit uneven light.

Embodiment 7

The following describes a semiconductor light emitting device according to the seventh embodiment. The structure of a semiconductor light emitting device according to the present embodiment may be, for example, similar to the structure in the fifth embodiment shown in FIG. 7 or FIG. 10.

In the semiconductor light emitting device according to the fifth embodiment shown in FIG. 9 or FIG. 10, the light scattering particles 18 in the resin layer 17 may be light scattering phosphors made of rare-earth phosphors which absorb light from the semiconductor light emitting element 14 and emit excitation light from quantum dot phosphors as fluorescence. That is, the light scattering particles 18 may be phosphors which absorb a part of light emitted by the semiconductor light emitting element 14 and have an emission spectrum including a wavelength absorbed by the quantum dot phosphors. Moreover, also in the present embodiment, it is preferable that the particle size of the light scattering particles 18 of phosphors be at least 100 nm.

In the seventh embodiment, yttrium aluminum garnet (YAG) phosphors which are rare-earth phosphors are used as light-scattering phosphors which are the light scattering particles 18. Moreover, red quantum dot phosphors which emit red fluorescent light are contained in the phosphor layer 15 which is a resin layer.

Thus, according to the structure of the semiconductor light emitting device in the present embodiment, the YAG phosphors in the resin layer 17 absorb a part of blue light emitted by the semiconductor light emitting element 14 which emits the blue light, and emit yellow-green fluorescent light. Moreover, the red quantum dot phosphors absorb a part of the yellow-green emission light and emit red fluorescent light. This can achieve high color rendering properties.

It should be noted that the light scattering particles 18 do not have to be limited to the YAG phosphors as long as the light scattering particles 18 are phosphors which can absorb blue light emitted by the semiconductor light emitting element 14 and perform wavelength conversion. The fluorescence spectrum of the YAG phosphor spreads over a long-wavelength area of at least 700 nm with little luminosity. Although color rendering properties can be improved by the combination with the red quantum dot phosphor, there is little change in efficiency of light emission (lm/W). On the other hand, for a phosphor which has a fluorescence spectrum mainly representing green with high luminosity and whose fluorescence spectrum does not spread over the long-wavelength side of 700 nm or greater such as a sialon (SiAlON) phosphor, the efficiency of light emission (lm/W) is higher than that of the YAG phosphor. Therefore, white light with high color rendering properties and high efficiency of light emission (lm/W) can be obtained by using the SiAlON phosphor as the light scattering particle 18 and combining with the red quantum dot phosphor.

Moreover, according to this structure, the quantum dot phosphors convert the wavelength from green to red. In this case, strokes loss is smaller than when the wavelength is converted from blue to red. Therefore, the heat value of the quantum dot phosphors decreases. That is, since the light scattering particles 18 convert into a long-wavelength side a part of light emitted by the semiconductor light emitting element 14. Therefore, the strokes loss caused by the quantum dot phosphors decreases. This enables to further reduce temperature rise in a quantum dot. Therefore, it is possible to provide a semiconductor light emitting device with high reliability and high color rendering properties.

Embodiment 8

Figure 11:
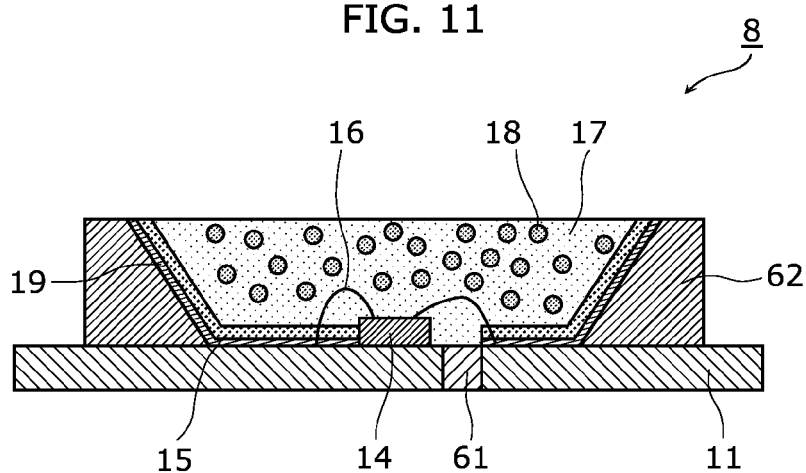
FIG. 11 is a cross-sectional schematic view of a semiconductor light emitting device according to the eighth embodiment.

With reference to FIG. 11, the following describes a semiconductor light emitting device 8 according to the eighth embodiment. FIG. 11 is a cross-sectional schematic view of a semiconductor light emitting device according to the eighth embodiment.

In the eighth embodiment, to efficiently extract, from the semiconductor light emitting device, fluorescence obtained from the phosphor layer 15, the phosphor layer 15 is formed over a high-reflective metal film.

As shown in FIG. 11, in the present embodiment, a metal reflective film 19 of bright silver (Ag) is formed over the lead frame 11 and an insulating resin layer 62 by electroless deposition. The metal reflective film 19 is formed over the inner wall of the package having the conductive area which is the lead frame 11, except the area for mounting the semiconductor light emitting element 14 and the areas to be connected to the wires.

Here, the P and N electrodes of the semiconductor light emitting element 14 must not be short-circuited by the metal reflective film 19. In the eighth embodiment, insulation of the device is ensured by protecting in advance the top surface of an insulating resin layer 61 with a resist or the like before plating process so as to leave an area not to be plated with silver (Ag). In the present embodiment, the metal reflective film 19 is formed over the side and bottom of the recess of the package.

Moreover, by electrodeposition using the metal reflective film 19 of this silver (Ag) plating as an electrode, the phosphor layer 15 is formed over the surface of the metal reflective film 19.

Thus, according to the semiconductor light emitting device in the present embodiment, since the phosphor layer 15 is formed over the metal reflective film 19, the heat dissipation of the phosphor layer 15 can be further improved. Therefore, a semiconductor light emitting device with high reliability can be provided.

Furthermore, since electroless plating is used in the present embodiment, the metal reflective film 19 can be formed over the insulating resin layer 62. Therefore, by using electrodeposition method using the metal reflective film 19 as an electrode, the phosphor layer 15 can be easily formed over the side of the inside of the package. Moreover, since the metal reflective film 19 has a higher thermal conductivity than that of the insulating resin layer 62, the heat dissipation of the phosphor layer 15 is improved, and thus temperature rise in quantum dot phosphors can be reduced.

Moreover, according to a production method of the semiconductor light emitting device in the present embodiment, the phosphor layer 15 is formed, by the electrodeposition method, over the surface of the metal reflective film 19 formed in the package, in a state where electrical insulation between the electrodes of the semiconductor light emitting element 14 is maintained. Therefore, the contact area of the phosphor layer 15 and the metal reflective film 19 with a good thermal conductivity is large. This can efficiently reduce temperature rise in the phosphor layer 15. Therefore, it is possible to fabricate a semiconductor light emitting device with high reliability, high efficiency, and high color rendering properties.

Embodiment 9

Figure 12:
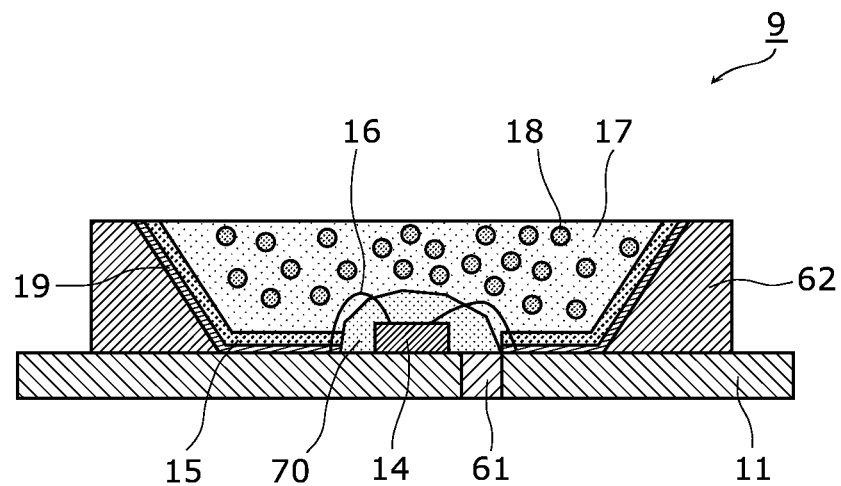
FIG. 12 is a cross-sectional schematic view of a semiconductor light emitting device according to the ninth embodiment.
Figure 13:
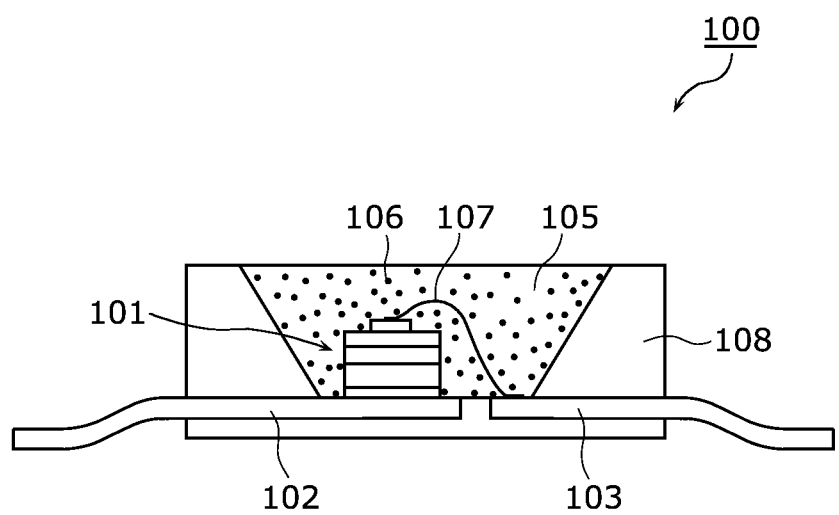
FIG. 13 is a cross-sectional view of a conventional semiconductor light emitting device.

With reference to FIG. 12, the following describes a semiconductor light emitting device 9 according to the ninth embodiment. FIG. 12 is a cross-sectional schematic view of a semiconductor light emitting device according to the ninth embodiment.

The semiconductor light emitting element 14 is one of the highest temperature areas in the semiconductor light emitting device according to the present embodiment. On the other hand, when a resin layer 17 contains ceramic light scattering particles 18, the thermal conductivity of the resin layer 17 increases, and heat from the semiconductor light emitting element 14 reaches the phosphor layer 15 via the resin layer 17, resulting in temperature rise in the phosphor layer 15. In particular, when the semiconductor light emitting element 14 is caused to operate at high output, the junction temperature may be over 150 degree Celsius. This accelerates the degradation of the phosphor layer 15.

Therefore, in the present embodiment, the semiconductor light emitting element 14 is covered by a transparent resin layer 70 which does not contain ceramic fine particles, in order to prevent the heat from the semiconductor light emitting element 14 from being transferred to the phosphor layer 15 while dissipating the heat from the phosphor layer 15 during wavelength conversion into the conductive area of the lead frame 11.

In the present embodiment, the transparent resin layer 70 is only made of a silicone resin, and is formed in a dome shape so as to cover the semiconductor light emitting element 14. Thus, since the transparent resin layer 70 does not contain ceramic fine particles, the thermal conductivity of the transparent resin layer 70 is maintained lower than that of the resin layer 17. Therefore, it is possible to prevent the heat from the semiconductor light emitting element 14 from being transferred upward (to side of the resin layer 17). This allows most of the heat from the semiconductor light emitting element 14 to dissipate through the lead frame 11. Therefore, it is possible to reduce temperature rise in the phosphor layer 15 even when the semiconductor light emitting element 14 operates at high output.

Thus, according to the semiconductor light emitting device in the present embodiment, both of the heat dissipation of the phosphor layer 15 during the wavelength conversion and the thermal shield from the semiconductor light emitting element 14 to the phosphor layer 15 are made possible. Therefore, it is possible to reduce temperature rise in the phosphor layer 15 also during high output operation. This can provide a semiconductor light emitting device with high reliability.

With reference to FIG. 12, the following describes an example of the production method in the present embodiment.

The metal reflective film 19 is deposited on the inner wall of the area (recess) surrounded by the insulating resin layer 62 formed on the lead frame 11. Then, the phosphor layer 15 containing quantum dot phosphors are deposited over the metal reflective film 19.

After the semiconductor light emitting element 14 is mounted on a predetermined area on the lead frame 11, and the semiconductor light emitting element 14 and gold wires 16 are connected by wire bonding, the transparent resin layer 70 of a silicone resin is applied over the semiconductor light emitting element 14. In this state, defoaming is once performed. The silicone resin is shaped by performing heat curing at 150 degree Celsius for 30 minutes.

The resin layer 17 is formed by injecting a silicone resin containing light scattering particles 18 into the area above the phosphor layer 15 and the transparent resin layer 70 so as to fill in the recess of the insulating resin layer 62. This enables to fabricate the semiconductor light emitting device 9 of the structure as shown in FIG. 12.

It should be noted that unlike the above production method, before depositing the phosphor layer 15 over the metal reflective film 19, the semiconductor light emitting element 14 and the lead frame 11 may be connected via the wires 16 and the transparent resin layer 70 may be formed, and after that, the phosphor layer 15 may be formed.

Although the semiconductor light emitting devices according to the present disclosure were described based on the embodiments, the present disclosure is not limited to the above embodiments.

For example, in the embodiments, LEDs are exemplified as the semiconductor light emitting element 14. However, a semiconductor light emitting element such as a semiconductor laser, an organic electro luminescence (EL) element, or an inorganic EL element.

Moreover, although the blue LED is used as the semiconductor light emitting element 14 in the embodiments, the semiconductor light emitting element 14 is not limited to this. Moreover, the combinations of the luminescent color of the semiconductor light emitting element 14 and the fluorescent color of the quantum dot phosphors in the phosphor layer 15 are not limited to the combinations shown in the embodiments. For example, light from the blue LED which emits blue light and light from yellow phosphor particles which are excited by the blue light and emit yellow light may be mixed so that white light is emitted. Alternatively, (i) light from an ultraviolet LED which emits ultraviolet light having a wavelength shorter than that of the blue LED and (ii) light from any combinations of blue phosphor particles, green phosphor particles, and red phosphor particles which are mainly excited by ultraviolet light and respectively emit blue light, green light, and red light may be mixed so that white light is emitted. This can realize a semiconductor light emitting device with high color rendering properties.

Those skilled in the art will readily appreciate that many modifications are possible in the exemplary embodiments without materially departing from the scope of the present disclosure, and such modifications are also included in the present disclosure. The structural elements in the embodiments may be arbitrarily combined without materially departing from the scope of the present disclosure.

INDUSTRIAL APPLICABILITY

According to the present disclosure, it is possible to realize a semiconductor light emitting device with high reliability, high efficiency, and high color rendering properties, and it is widely useful as a white LED light source and others of a display device, lighting equipment, and the like.

The invention claimed is:

1. A semiconductor light emitting device comprising:
   a package which is made of a resin and includes a recess;
   a lead frame exposed to a bottom of the recess;
   a semiconductor light emitting element connected to the lead frame in the recess;
   a first resin layer over the bottom of the recess; and
   a second resin layer above the first resin layer and the semiconductor light emitting element, wherein the first resin layer contains a semiconductor fine particle having an excitation fluorescence spectrum which changes according to a particle size, and the first resin layer comprises a water-soluble or water-dispersible material.

2. The semiconductor light emitting device according to claim 1, further comprising a metal reflective film over the bottom and a side of the recess, wherein the first resin layer covers the metal reflective film.

3. The semiconductor light emitting device according to claim 1, wherein the semiconductor fine particle has a layer structure of at least two layers an outermost layer among which is hydrophobic.

4. The Semiconductor light emitting device according to claim 1, wherein the first resin layer is made of an acrylic resin, an epoxy resin, or a fluororesin.

5. The semiconductor light emitting device according to claim 1, wherein the second resin layer contains a light scattering particle which scatters visible light.

6. The semiconductor light emitting device according to claim 1, wherein the semiconductor fine particle has a particle size of around 1 nm to 20 nm.

7. The semiconductor light emitting device according to claim 1, wherein the semiconductor fine particle is a quantum dot phosphor having InP.

8. The semiconductor light emitting device according to claim 1 wherein the semiconductor fine particle is a cadmium quantum dot phosphor or a chalcogenide fine particle.

9. The semiconductor light emitting device according to claim 5, wherein the light scattering particle is a white fine particle which reflects the visible light and has a particle size of at least 100 nm.

10. The semiconductor light emitting device according to claim 5, wherein the light scattering particle is a phosphor fine particle which has a particle size of at least 100 nm, absorbs part of light emitted by the semiconductor light emitting element, and has an emission spectrum including a wavelength absorbed by the semiconductor fine particle.

11. The semiconductor light emitting device according to claim 10, wherein the semiconductor light emitting element emits blue light, the semiconductor fine particle emits red fluorescent light, and the light scattering particle is a rare-earth phosphor which emits green fluorescent light.

12. The semiconductor light emitting device according to claim 7, wherein the InP is a nucleus of the quantum dot phosphor.

13. The semiconductor light emitting device according to claim 12, wherein the quantum dot phosphor has a diameter of around 1 nm to 10 nm.

* * * * *